United States Patent
Gauthier et al.

(10) Patent No.: US 6,664,828 B2
(45) Date of Patent: Dec. 16, 2003

(54) POST-SILICON CONTROL OF PHASE LOCKED LOOP CHARGE PUMP CURRENT

(75) Inventors: Claude Gauthier, Fremont, CA (US); Brian Amick, Austin, TX (US); Pradeep Trivedi, Sunnyvale, CA (US); Dean Liu, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/131,306

(22) Filed: Apr. 24, 2002

(65) Prior Publication Data

US 2003/0201808 A1 Oct. 30, 2003

(51) Int. Cl.[7] .................................................. H03L 7/06
(52) U.S. Cl. .......................... 327/157; 327/159; 331/14
(58) Field of Search ................................. 327/156, 157, 327/159; 331/1 A, 17, 25

(56) References Cited

U.S. PATENT DOCUMENTS

| | | | | |
|---|---|---|---|---|
| 5,315,270 A | * | 5/1994 | Leonowich | 331/1 A |
| 5,668,503 A | * | 9/1997 | Gerbach et al. | 331/1 A |
| 6,097,227 A | * | 8/2000 | Hayashi | 327/158 |
| 6,140,881 A | * | 10/2000 | Kim | 331/20 |

OTHER PUBLICATIONS

"Low–Jitter Process–Independent DLL and PLL Based on Self–Biased Techniques" by John G. Maneatis as published in "IEEE Journal of Solid–State Circuits" vol. 31, No. 11, Nov., 1996 (10 pages).

* cited by examiner

*Primary Examiner*—Timothy P. Callahan
*Assistant Examiner*—An T. Luu
(74) *Attorney, Agent, or Firm*—Rosenthal & Osha L.L.P.

(57) ABSTRACT

A post-silicon technique for adjusting a current of a charge pump in a phase locked loop is provided. The technique involves use of an adjustment circuit operatively connected to the charge pump, where the adjustment circuit is controllable to facilitate an internal biasing of the charge pump. Such control of the charge pump current in a phase locked loop allows a designer to achieve desired PLL performance characteristics after the PLL has been fabricated.

16 Claims, 7 Drawing Sheets

POST-SILICON CONTROL OF PHASE LOCKED LOOP CHARGE PUMP CURRENT

BACKGROUND OF INVENTION

As shown in FIG. 1, a typical computer system 10 has, among other components, a microprocessor 12, one or more forms of memory 14, integrated circuits 16 having specific functionalities, and peripheral computer resources (not shown), e.g., monitor, keyboard, software programs, etc. These components communicate with one another via communication paths 19, e.g., wires, buses, etc., to accomplish the various tasks of the computer system 10.

In order to properly accomplish such tasks, the computer system 10 relies on the basis of time to coordinate its various operations. To that end, a crystal oscillator 18 generates a system clock signal (also referred to and known in the art as "reference clock"), SYS_CLK, to various parts of the computer system 10. Modern microprocessors and other integrated circuits, however, are typically capable of operating at frequencies significantly higher than the system clock, and thus, it becomes important to ensure that operations involving the microprocessor 12, and the other components of the computer system 10 use a proper and accurate reference of time.

One component used within the computer system 10 to ensure a proper reference of time among a system clock and a microprocessor clock, i.e., "chip clock," is a type of clock generator known as a phase locked loop, or "PLL" 20. The PLL 20 is an electronic circuit that controls an oscillator such that the oscillator maintains a constant phase relative to a reference signal. Referring to FIG. 1, the PLL 20 has as its input the system clock, which is its reference signal, and outputs a chip clock signal, CHIP_CLK, to the microprocessor 12. The system clock and chip clock have a specific phase and frequency relationship controlled by the PLL 20. This relationship between the phases and frequencies of the system clock and chip clock ensures that the various components within the microprocessor 12 use a controlled and accounted for reference of time. When this relationship is not maintained by the PLL 20, however, the operations within the computer system 10 become non-deterministic.

FIG. 2 shows a PLL 20. The PLL 20 includes a feedback loop that aligns the transition edge and frequency of a system clock, SYS_CLK 41, and a feedback loop signal, FBK_CLK 40. The PLL 20 adjusts the output frequency in order to zero any phase and frequency difference between the system clock 41 and the feedback loop signal 40. The addition of a divide-by-N stage 39 in the feedback loop enables the PLL 20 to generate an output that has a frequency of N times the system clock 41 frequency. Multiplying the system clock 41 is necessary when a chip clock, CHIP_CLK 42, must have a higher frequency than the system clock 41. The PLL core 36 adjusts the output frequency in order to zero any phase and frequency difference between the system clock 41 and the feedback loop signal 40. By adding the divide-by-N stage 39, the chip clock 42 must be N times faster to allow the phase and frequency difference between the system clock 41 and the feedback loop signal 40 to zero. The PLL 20 may also have buffers 37 and 38 to drive a larger resistive and/or capacitive load. The buffers 37 and 38 are in the feedback loop so that any phase shift created by the buffers 37 and 38 is zeroed by the PLL core 36.

One common performance measure for a PLL is jitter. Jitter is the time domain error from poor spectral purity of an output. In other words, in a repeated output pattern, such as a clock signal, a transition that occurs from one state to another does not happen at the same time relative to other transitions. Jitter represents the perturbations that result in the intermittent shortening or lengthening of signal elements of an output. The system clock may have jitter that may need to be filtered by the PLL. The PLL may need to follow and compensate for jitter at the PLL output.

Phase locked loops are basically second order feedback control systems. As such, the phase locked loop can be described in the frequency domain as having a damping factor and natural frequency. The damping factor and natural frequency are fixed by the selection of the PLL circuit parameters. The loop bandwidth is defined as the PLL input frequency at which the PLL output magnitude is 3 dB lower than the PLL output magnitude when the PLL input frequency is zero (DC). The loop bandwidth determines to a large degree the speed at which the phase locked loop can react to a disturbance. The PLL should have a low loop bandwidth so that input clock jitter is filtered. Power supply noise will, however, have a certain noise-versus-frequency characteristic. The PLL loop bandwidth may need to be increased to recover from the generation of output jitter caused by power supply noise.

SUMMARY OF INVENTION

According to one aspect of the present invention, an integrated circuit comprises: a phase locked loop including a phase frequency detector that detects a phase difference between a system clock signal and a feedback clock signal, a charge pump, responsive to the phase frequency detector, that generates a current on a control signal, a bias generator, responsive to the control signal, that generates a bias voltage, and a voltage controlled oscillator, responsive to the bias voltage, that generates an output clock signal; and an adjustment circuit operatively connected to the charge pump, where the adjustment circuit is controllable to adjust the current output from the charge pump.

According to another aspect, a phase locked loop comprises a phase frequency detector that detects a phase difference between a system clock signal and a feedback clock signal; a charge pump, responsive to the phase frequency detector and an adjustment circuit operatively connected to the charge pump, that generates a current signal, where the adjustment circuit is controllable to adjust the current signal; a bias generator, responsive to the current signal, that generates a bias voltage; and a voltage controlled oscillator, responsive to the bias voltage, that generates an output clock signal.

According to another aspect, a method for post-silicon adjustment of a phase locked loop comprises comparing an input clock signal and a feedback clock signal; generating a current signal using a charge pump responsive to the comparing; selectively adjusting the current signal using an adjustment circuit operatively connected to the charge pump; and generating a bias voltage to a voltage controlled oscillator responsive to the current signal, wherein the voltage controlled oscillator generates an output clock signal.

According to another aspect, an integrated circuit comprises: phase locked loop means for generating an output clock signal where the phase locked loop means includes comparing means for detecting a phase difference between an input clock signal and a feedback clock signal (where the feedback clock signal is based on the output clock signal), charge pumping means for generating a current on a control signal (where the charge pumping means is responsive to the comparing means), bias generating means for generating a bias voltage (where the bias generating means is responsive to the control signal), and oscillator means for generating the output clock signal (where the oscillator means is responsive to the bias voltage); and adjusting means for adjusting the current output from the charge pumping means, where the charge pumping means is responsive to the adjusting means.

Other aspects and advantages of the invention will be apparent from the following description and the appended claims.

DETAILED DESCRIPTION

Figure 1:
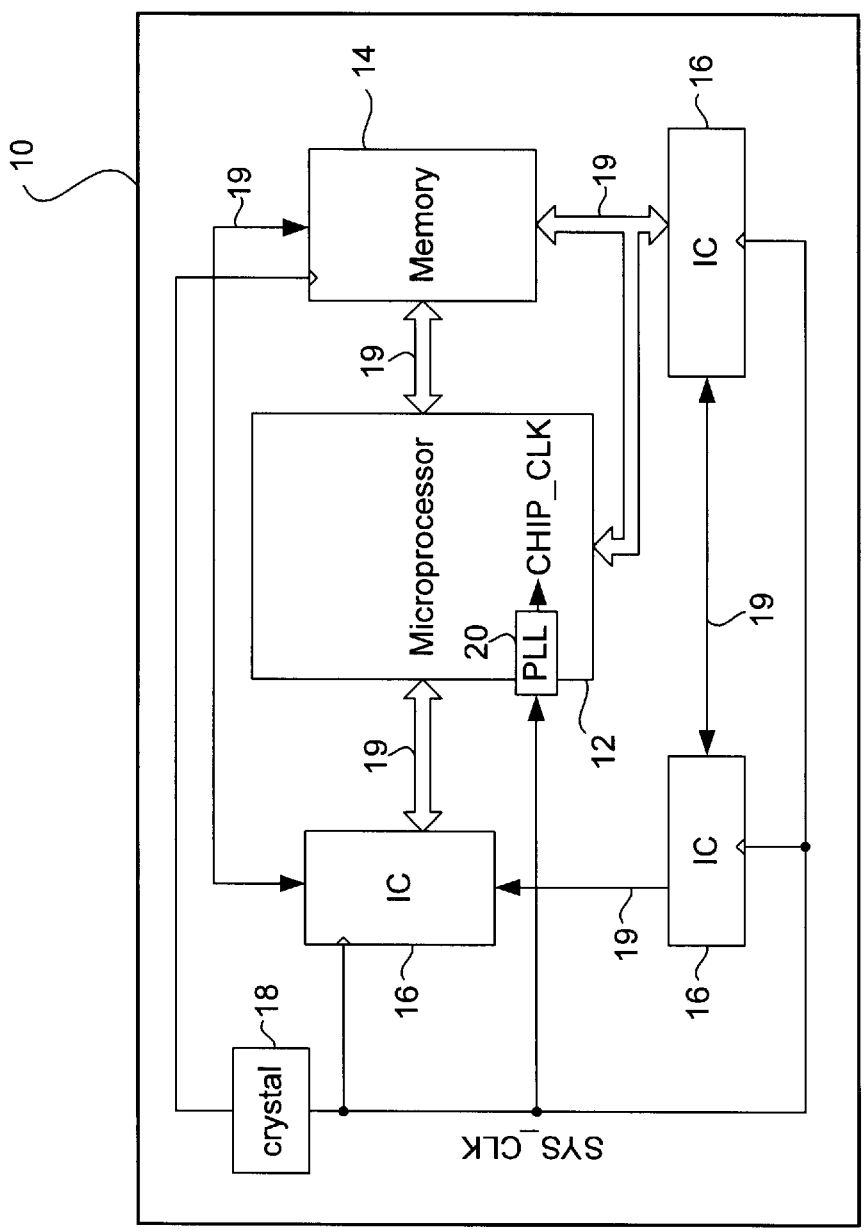
FIG. 1 shows a typical computer system.
Figure 2:
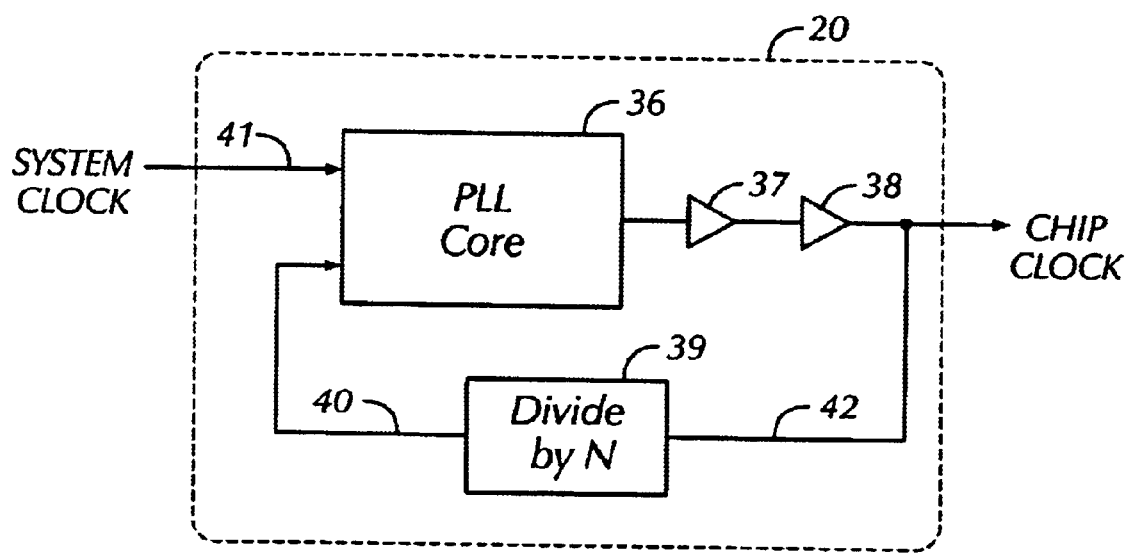
FIG. 2 shows a block diagram of a typical phase locked loop.
Figure 3A:
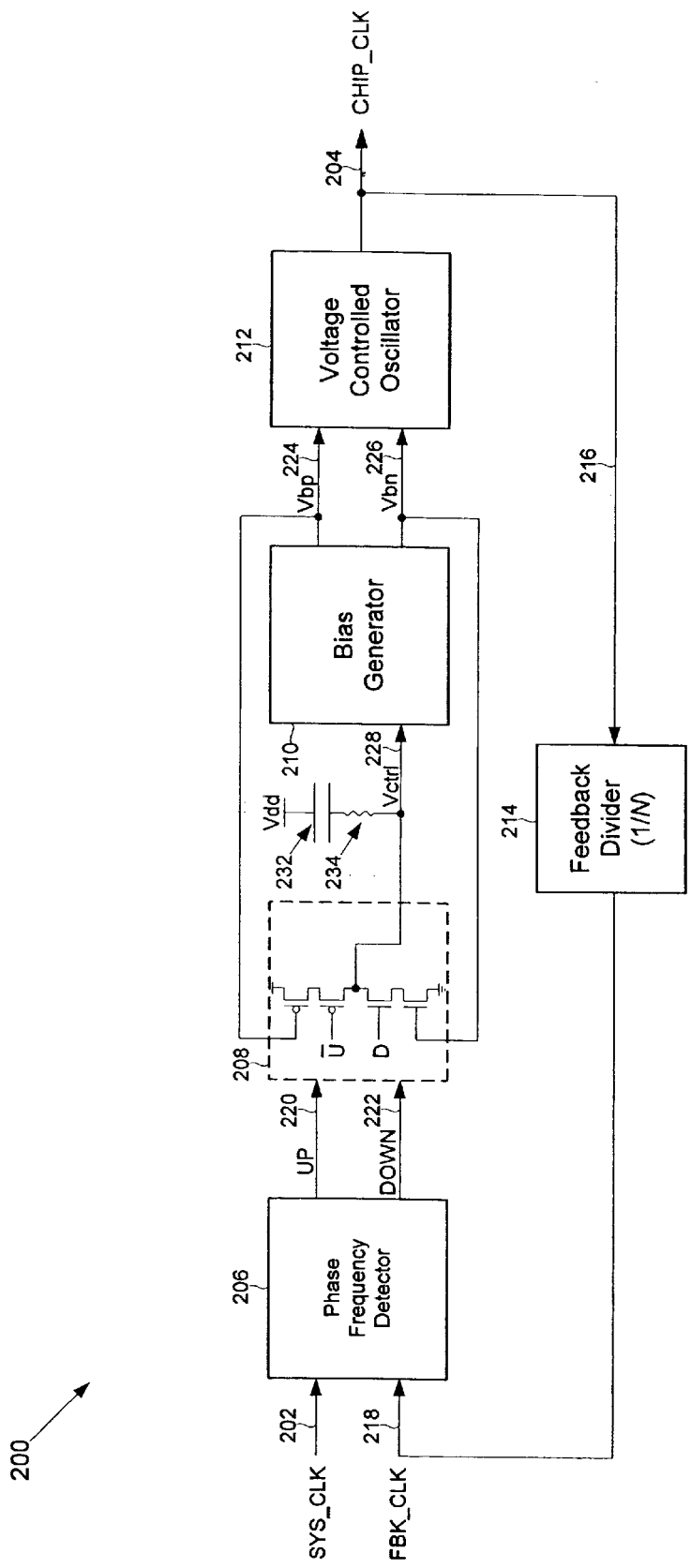
FIG. 3a shows a circuit diagram of a phase locked loop.

FIG. 3a shows a diagram of a PLL 200. A system clock, SYS_CLK 202, serves as an input to the PLL 20 and is used to create a phased output, chip clock 204. The basic elements of the PLL 200 are a phase frequency detector 206, a charge pump 208, a loop filter shown here comprising capacitor 232 and resistor 234, and a voltage controlled oscillator 212. Because the chip clock 204 is typically desired to have a significantly higher frequency than the system clock 202, a divide-by-N circuit 214 is positioned in a feedback loop 216 of the PLL 200. The divide-by-N circuit 214 is used to reduce, i.e., divide down, the frequency of the chip clock 204 so that the system clock 202 can be compared with a feedback clock, FBK_CLK 218.

The phase frequency detector 206 measures the phase and frequency difference between the system clock 202 and the feedback clock 218. Based on the comparison, the phase frequency detector 206 generates UP and DOWN signals 220 and 222 that control the charge pump 208 by causing the charge pump 208 to increase or decease the net charge at an output of the charge pump 208. Furthermore, as shown in FIG. 3a, an internal biasing of the charge pump 208 is dependent on bias signals, Vbp 224 and Vbn 226, generated by the bias generator 210. The charge pump 208 is arranged as such to guarantee that the charge pump 208 has some nominal current. Thus, depending on the UP and DOWN signals 220 and 222 and Vbp 224 and Vbn 226, the charge pump 208 adds or removes charge from a control voltage, Vctrl 228. The control voltage is further dependent on a loop filter formed by a capacitance 230 and a resistance 232.

The control voltage 228 serves as an input to the bias generator 210, which, as mentioned above, generates bias signals Vbp 224 and Vbn 226. Bias signals Vbp 224 and Vbn 226 are used to control the voltage controlled oscillator 212, which, in turn, generates the chip clock 204, where the chip clock 204 has a frequency in relation to the bias signal inputs to the voltage controlled oscillator 212.

Those skilled in the art will note that because the input(s) to the voltage controlled oscillator 212 may be susceptible to power supply noise, the chip clock 204 may jitter. Accordingly, the amount of capacitance 232 in the loop filter helps determine how much of the power supply noise affects the voltage controlled oscillator 212.

Figure 3B:
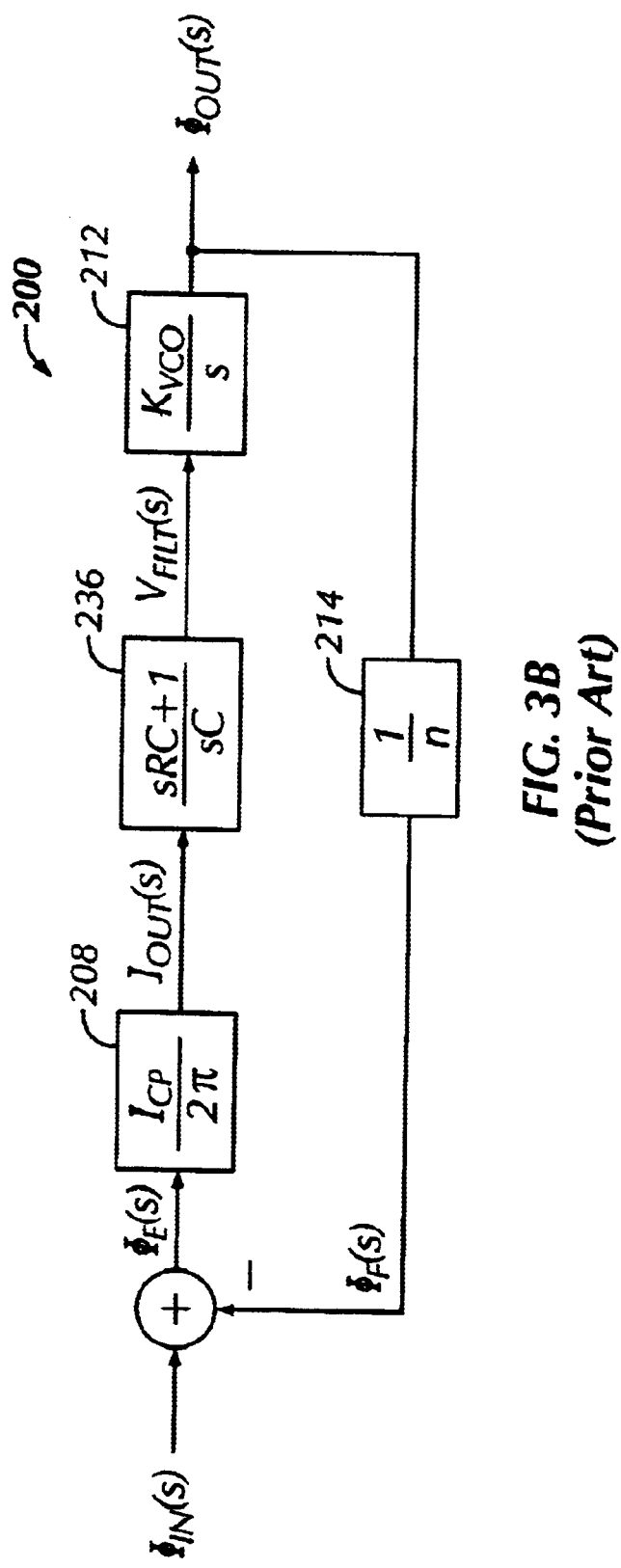
FIG. 3b shows a control diagram of a phase locked loop.

In FIG. 3b, the frequency response of the PLL 200 may be analyzed with a Laplace transform approximation, where the sample operation of the phase-frequency detector is ignored. This approximation is useful for loop bandwidths about a decade or more below the operating frequency of the PLL. This loop bandwidth constraint is also required for stability due to the reduced phase margin near the higher order poles that result from the delay around the sampled feedback loop. The modeled charge pump 208 adds or removes charge to its output depending on the state of input control pulse signals UP and DOWN 220 and 222 (shown in FIG. 3a). Both pulses may be 'on' at the same time, however, if one of the UP 220 and DOWN 222 pulse remains 'on' longer than the other, the net charge at the output of the charge pump 208 accordingly increases or decreases. The charge pump gain may be modeled as a linear gain versus phase error where $I_{OUT}(s)/\Phi_E(s)=I_{CP}/2\pi$. A loop filter 236 of the PLL may be modeled as a series combination of a capacitor, C 232, and a resistor, R 234, connected from $I_{OUT}$ to ground. The loop filter 236 transforms the output of the charge pump 208, $I_{OUT}$, into the voltage-controlled oscillator input voltage, $V_{FILT}$. The Laplace transform of the series resistor 234 and capacitor 232 in the loop filter 236 is $V_{FILT(s)}/I_{OUT}(s)=(sRC+1)/(sC)$. The transfer function of the capacitor and resistor shows that a zero is added that adds stability to the PLL loop. The voltage controlled oscillator 212 outputs a clock that has a frequency proportional to the input voltage $V_{FILT}$. The Laplace transform of the voltage controlled oscillator 212 is $\Phi_{OUT}(s)/V_{FILT}(s)=I_{CP}/V_{FILT}(s)=K_{VCO}/s$. The closed-loop transfer function can now be derived as $H(s)=\Phi_{OUT}(s)/\Phi_{IN}(s)= [(RK_{VCO}I_{CP}/2\pi)/(s+1/RC)]/[s^2+sRCK_{VCO}I_{CP}/2\pi NC+ K_{VCO}I_{CP}/2\pi NC]$. H(s) is a second order system that has one pole from the loop filter 236 and one pole from the voltage controlled oscillator 212, and one zero from the resistor, R, in the loop filter 236. The transfer function H(s) has a natural frequency $\omega_n=(K_{VCO}I_{CP}/2\pi NC)^{0.5}$ and a damping factor $\zeta=RC\omega_n/2$.

The loop bandwidth is defined, as the frequency at which the output magnitude is 3 dB lower than when the input is DC. Loop bandwidth is not the same as natural frequency, although they are often close. Once $\zeta$, $\omega_n$, $K_{VCO}$, and $I_{CP}$ are chosen, the values for R and C can be determined for any selected loop bandwidth. Low loop bandwidth allows the PLL to filter input error. High loop bandwidth allows the PLL to follow and compensate for output error induced by power supply noise. Thus, a design tradeoff must be made in the loop bandwidth of the PLL. The value for C has a large effect on loop bandwidth and natural frequency. Optimizing the PLL loop bandwidth relates to balancing the effect and treatment of input error with the PLL loop's speed of response to compensate for output error induced by power supply noise.

As partly discussed above, in a PLL, jitter may be a function of various parameters: power supply variation, input and output error, loop bandwidth, substrate noise, etc. Although a designer may intend for an integrated circuit to have particular values for these parameters, most of the actual values for these parameters are unknown until the integrated circuit has been fabricated (i.e., is in a post-silicon or post-fabrication stage). For example, with respect to the loop dynamics of a PLL (i.e., how quickly the PLL corrects its output), a designer may intend for the loop bandwidth to operate in a particular frequency range. Unfortunately, the loop bandwidth may be affected by many process technology factors in the fabrication process. Because the PLL cannot be redesigned in the post-silicon stage without considerable temporal and monetary expenditures, these constraints may cause the PLL to have a different operating frequency range than designed and poor jitter performance. Accordingly, a technique and design that facilitates increased post-silicon control of a PLL is desirable.

Embodiments of the present invention relate to an integrated circuit that has a phase locked loop and an adjustment circuit, where the adjustment circuit is controllable to adjust an operating characteristic of the phase locked loop. Embodiments of the present invention further relate to an integrated circuit that has a phase locked loop and an adjustment circuit, where the adjustment circuit is controllable to adjust a current of a charge pump within the phase locked loop. Embodiments of the present invention further relate to a post-silicon method for modifying the operation of a phase locked loop by adjusting a current of a charge pump within the phase locked loop.

Those skilled in the art will note that the current of a charge pump within a PLL is directly related to the loop bandwidth of the PLL. In other words, the current of the charge pump directly affects the rate at which the PLL can react to disturbances.

Figure 4:
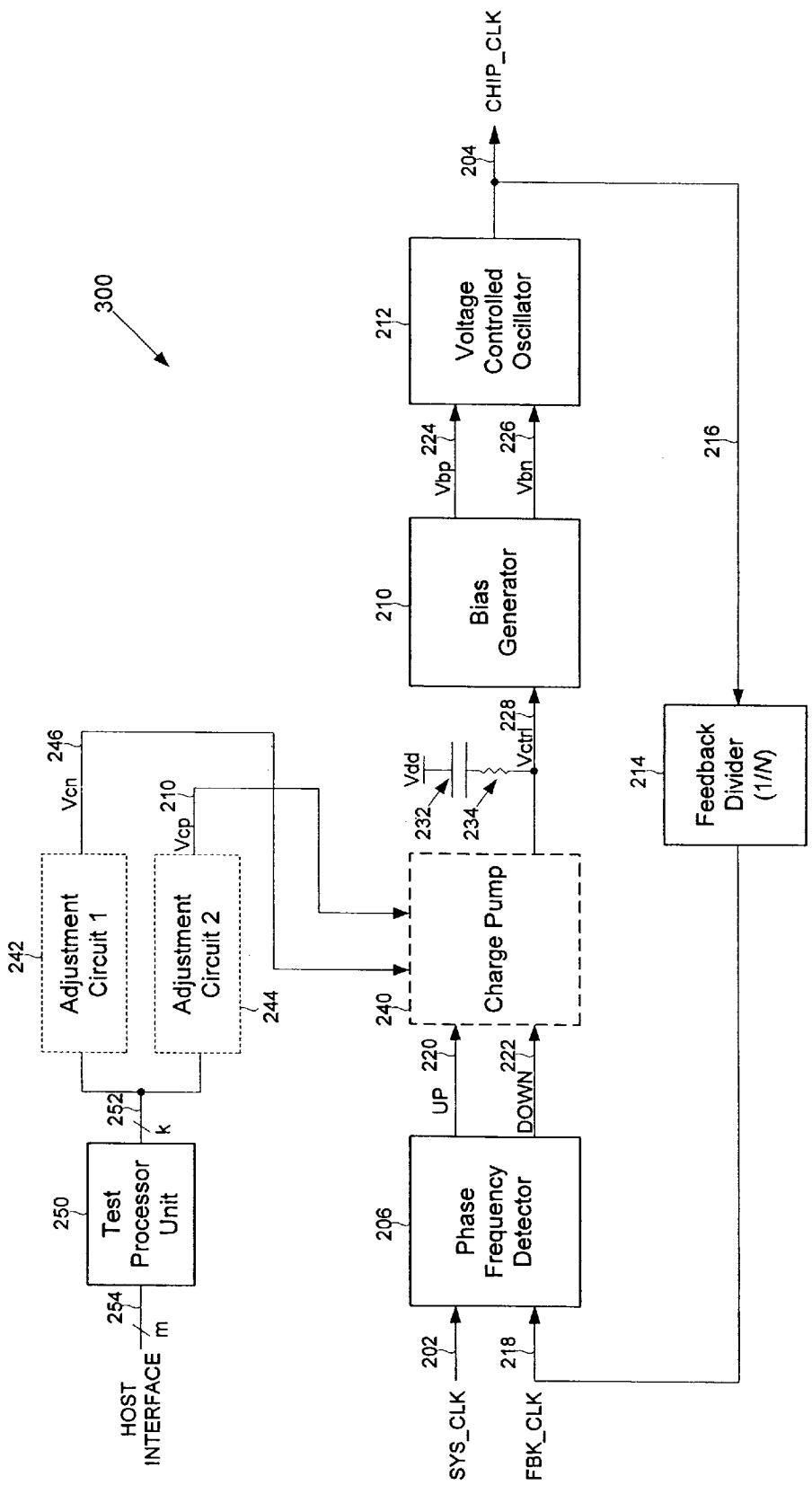
FIG. 4 shows a phase locked loop and adjustment circuits in accordance with an embodiment of the present invention.

FIG. 4 shows an exemplary embodiment of the present invention. In FIG. 4, the phase frequency detector 206, the capacitor 232, the resistor 234, the bias generator 210, the voltage controlled oscillator 212, and the divide-by-N circuit 214 may operate similarly to the corresponding components shown in the PLL 200 of FIG. 3a.

In FIG. 4, adjustment circuits 242 and 244 are operatively connected to a charge pump 240 via adjustment control voltages Vcn 246 and Vcp 248, respectively, where the adjustment circuits 242 and 244 are controllable to adjust adjustment control voltages Vcn 246 and Vcp 248 in order to adjust internal biasing voltages within the charge pump 240, thereby adjusting the nominal current of the charge pump 240. As is apparent from FIG. 4, the charge pump 240 is responsive to adjustment control voltages Vcn 246 and Vcp 248 and is not responsive to bias signals Vbp 224 and Vbn 226 (as it was in FIG. 3a). A detailed discussion of the charge pump 240 is given below with reference to FIG. 5b.

In FIG. 4, a test processor unit 250 controls the adjusment circuits 242 and 244 using k control signals 252. The values of the k control signals 252 may be determined by the contents of registers or other storage devices maintained in the test processor unit 250. In some embodiments, the test processor unit 250 may be accessed through a host interface, where the host interface communicates with the test processor unit 250 via m communication lines 254.

Those skilled in the art will appreciate that the host interface and the m communication lines 254 may be implemented using one or more of a variety of forms. For example, the host interface may be operated from a computer system distinct from the one in which the PLL 300 resides. In some embodiments, the communication occurring on the host interface and m communication lines 254 may be defined by an industry standard such as JTAG (IEEE 1149).

Figure 5A:
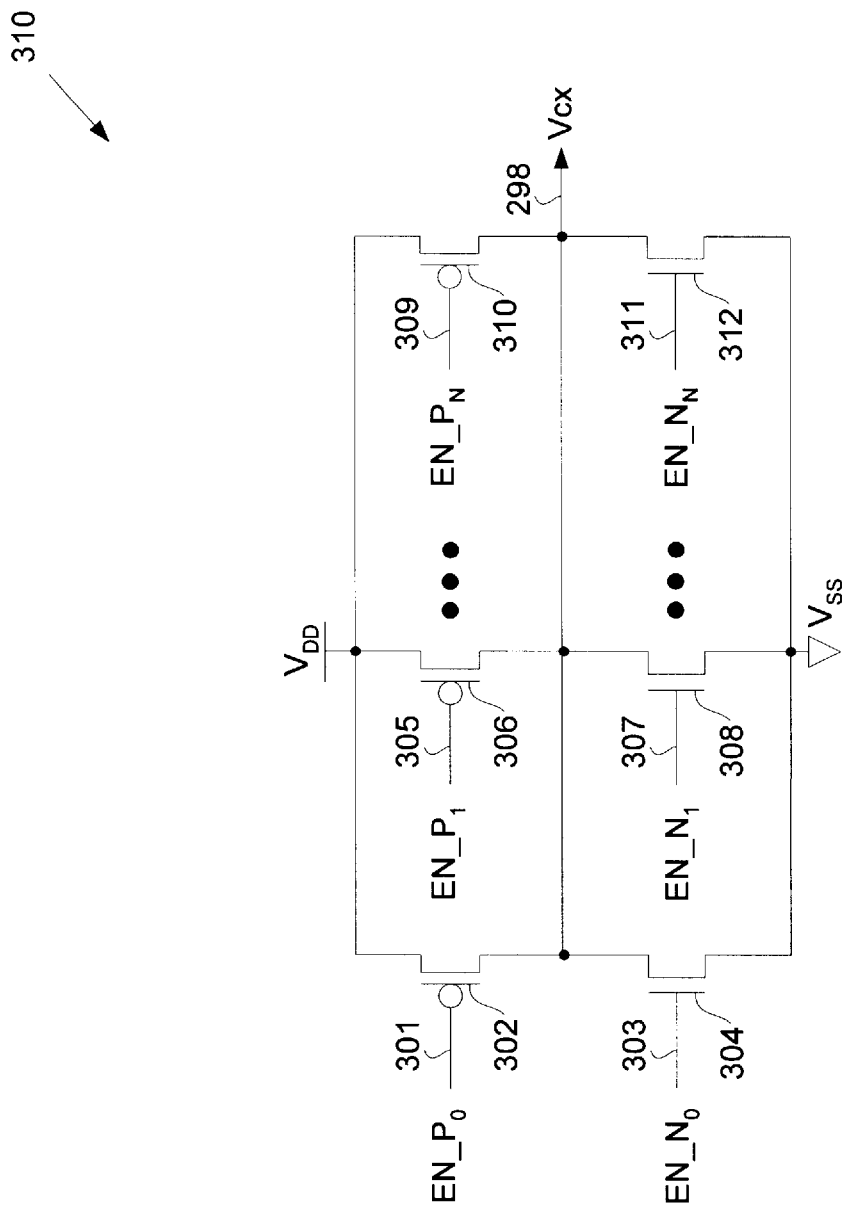
FIG. 5a shows an adjustment circuit in accordance with an embodiment of the present invention.

FIG. 5a shows an exemplary adjustment circuit 310 in accordance with an embodiment of the present invention. Those skilled in the art will understand that the adjustment circuit 310 shown in FIG. 5a is representative of the adjustment circuits 242 and 244 shown in FIG. 4.

In FIG. 5a, the adjustment circuit 300 includes p-channel transistors 302, 306, and 310 arranged in parallel with each other. The p-channel transistors 302, 306, and 310 connect between a power supply, Vdd, and a common node, Vcx 298. Those skilled in the art will note that the common node Vcx 298 corresponds to Vcn 246 and Vcp 248 in FIG. 4. Referring back to FIG. 5a, the adjustment circuit 300 also includes n-channel transistors 304, 308, and 312 arranged in parallel with each other. The n-channel transistors 304, 308, and 312 connect between ground, Vss, and the common node 298. The p-channel transistors 302, 306, and 310 are controlled by control signals EN_$P_0$ 301, EN_$P_1$ 305, and EN_$P_N$ 309, respectively. The n-channel transistors 304, 308, and 312 are controlled by control signals EN_$N_0$ 303, EN_$N_1$ 307, and EN_$N_N$ 311, respectively. A low voltage on any of the EN_P signals 301, 305, and, 309 will turn 'on' their respective p-channel transistors 302, 306, and 310. A high voltage on any of the EN_N signals 303, 307, and 311 will turn 'on' their respective n-channel transistors 304, 308, and 312.

Any p-channel transistor 302, 306, and 310 that is 'on' will have a tendency to increase the voltage on Vcx 298 toward Vdd. Any n-channel transistor 304, 308, and 312 that is 'on' will have a tendency to lower the voltage on Vcx 298 toward Vss. By selecting which p-channel transistors 302, 306, and 310 and/or n-channel transistors 304, 308, and 312 are 'on', a change in the voltage on Vcx 298 may be achieved.

Those with ordinary skill in the art will appreciate that the p-channel transistors 302, 306, and 310 and n-channel transistors 304, 308, and 312 may be turned 'on' individually or as a group. The p-channel transistors 302, 306, and 310 and n-channel transistors 304, 308, and 312 may be sized so that each transistor has a different effect compared to the other transistors, e.g., a transistor's gate width may be varied to adjust the strength of the transistor. The gate widths may be designed to provide a linear, exponential, or other function as more transistors are turned 'on.' The p-channel transistors 302, 306, and 310 and n-channel transistors 304, 308, and 312, may be sized so that each transistor has an inherently resistive nature; e.g., a transistor's gate length may be increased ('long-channel' transistors) to increase the inherent resistance of the transistor. A larger inherent resistance may be advantageous if both a p-channel transistor and a n-channel transistor are 'on' simultaneously. Those skilled in the art will appreciate that in other embodiments, the adjustment; circuit 300 may include only one p-channel transistor and one n-channel transistor connected in series.

The k control signals 252 in FIG. 4 may represent EN_N signals 303, 307, and 311 in FIG. 5a and EN_P signals 301, 305, and 309 in FIG. 5a. In other words, the k control signals 252 in FIG. 4 are used to turn 'on' or 'off' the p-channel transistors 302, 306, and 310 in FIG. 5a and n-channel transistors 304, 308, and 312 in FIG. 5a.

Figure 5B:
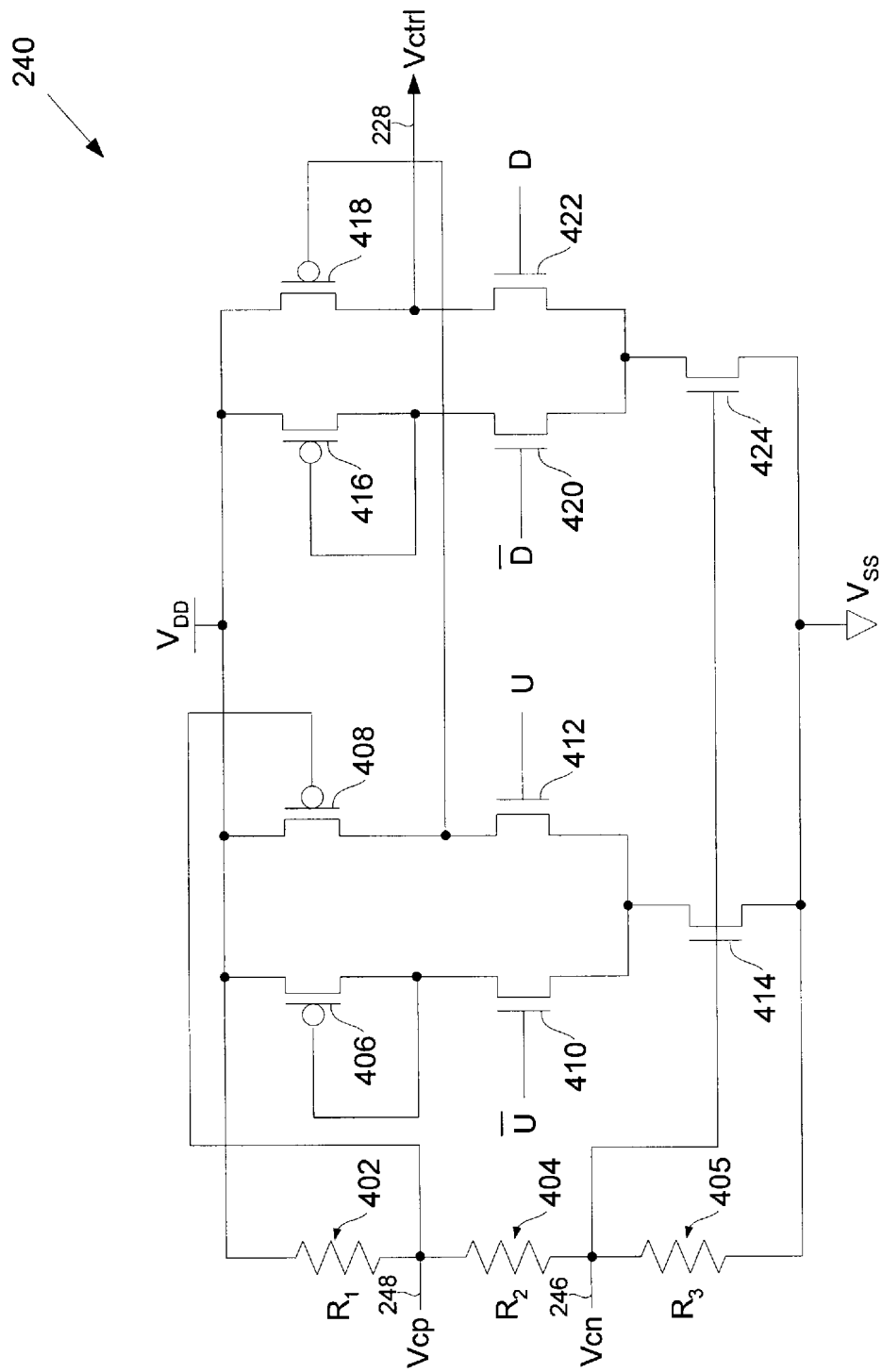
FIG. 5b shows a portion of a phase locked loop in accordance with the embodiment shown in FIG. 4.

FIG. 5b shows an exemplary charge pump 240 in accordance with the embodiment shown in FIG. 4. The charge pump 240 includes an internal biasing circuit that is implemented using a voltage divider formed by resistors R1 402, R2 404, and R3 405. This internal biasing circuit guarantees that the charge pump 240 will have some nominal current. In order to be able to adjust the charge pump current value to achieve desired operating characteristics, the adjustment circuit control voltages Vcn 246 and Vcp 248 (also shown in FIG. 4) are operatively connected to the internal biasing circuit of the charge pump 240. Thus, depending on the values of the resistors R1 402, R2 404, and R3 405 and the adjustment circuit control voltages Vcn 246 and Vcp 248, a first differential input stage and a second differential input stage control the output, Vctrl 228, of the charge pump 240, where the first differential input stage is also responsive to UP pulses from the phase frequency detector 206 (shown in FIG. 4) and is formed by transistors 406, 408, 410, and 412, and where the second differential input stage is also responsive to DOWN pulses from the phase frequency detector 206 (shown in FIG. 4) and is formed by transistors 416, 418, 420, and 422. The current flow through the first and second differential input stage is regulated by transistors 414 and 424, respectively, where transistors 414 and 424 are responsive to the internal biasing circuit and adjustment control voltages Vcn 246 and Vcp 248.

Advantages of the present invention may include one or more of the following. In some embodiments, because an adjustment circuit may be controlled to adjust a current of a charge pump in a phase locked loop, an investigation of the behavior of the phase locked loop during operating conditions may be performed. The adjustment circuit allows a designer to determine and achieve desired phase locked loop operating properties that differ from those determined and designed during pre-fabrication design and simulation of the phase locked loop.

In some embodiments, because an adjustment circuit may be controlled to adjust a current of a charge pump in a phase locked loop, fewer design iterations and higher confidence in phase locked loop operating characteristics may be afforded. Likewise, a response of the phase locked loop to various system disturbances such as power supply noise and input phase error may be realistically determined.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
   a phase locked loop, comprising:
      a phase frequency detector that detects a phase difference between a system clock signal and a feedback clock signal,
      a charge pump, responsive to the phase frequency detector, that outputs a current on a control signal,
      a bias generator, responsive to the control signal, that generates a bias voltage, and
      a voltage controlled oscillator, responsive to the bias voltage, that generates an output clock signal; and
      an adjustment circuit arranged to generate independent of the feedback clock signal, an adjustment signal to the charge pump, comprising:
         a first device that selectively facilitates current flow between a power supply and the adjustment signal; and
         a second device that selectively facilitates current flow between the adjustment signal and ground,
            wherein the adjustment signal is controllable to adjust the current output from the charge pump.

2. The integrated circuit of claim 1, wherein the feedback clock signal is based on the output clock signal.

3. The integrated circuit of claim 1, wherein the first device is a p-channel transistor and the second device is an n-channel transistor, and wherein the p-channel transistor and the n-channel transistor are arranged in series.

4. The integrated circuit of claim 1, wherein the adjustment circuit further comprises a third device arranged in parallel with the first device.

5. The integrated circuit of claim 1, wherein the adjustment circuit comprises a third device arranged in parallel with the second device.

6. The integrated circuit of claim 4, wherein the first device has a greater gate width than the third device.

7. The integrated circuit of claim 1, wherein the adjustment circuit comprises a third device arranged in parallel with the second device.

8. The integrated circuit of claim 7, wherein the second device has a longer channel than the third device.

9. The integrated circuit of claim 7, wherein the second device has a greater gate width than the third device.

10. The integrated circuit of claim 1, wherein the adjustment circuit is controlled by a binary control word.

11. The integrated circuit of claim 10, further comprising: a test processor unit that generates the binary control word.

12. An integrated circuit, comprising:
    phase locked loop means for generating an output clock signal, wherein the phase locked loop means comprises:
       comparing means for detecting a phase difference between an input clock signal and a feedback clock signal, wherein the feedback clock signal is based on the output clock signal,
       charge pumping means for generating a current on a control signal, wherein the charge pumping means is responsive to the comparing means,
       bias generating means for generating a bias voltage, wherein the bias generating means is responsive to the control signal, and
       oscillating means for generating the output clock signal, wherein the oscillator means is responsive to the bias voltage; and
    adjusting means for generating an adjustment signal independent of the feedback clock signal for adjusting the current output from the charge pump,
       wherein the charge pump means is responsive to the adjustment means, and
       wherein the adjusting means comprises:
          first controlling means for controlling a first current flow between a power supply and the adjustment signal; and
    second controlling means for controlling a second current flow between the adjustment signal and ground.

13. A phase locked loop, comprising:
    a phase frequency detector that detects a phase difference between a system clock signal and a feedback clock signal;
    a charge pump, responsive to the phase frequency detector and an adjustment circuit operatively connected to the charge pump, that generates a current signal,
    wherein the adjustment circuit is arranged to output independent of the feedback clock signal an adjustment signal that is controllable to adjust the current signal, and
    wherein the adjustment circuit comprises:
       a first device that selectively facilitates current flow between a power supply and the adjustment signal; and
       a second device that selectively facilitates current flow between the adjustment signal and ground;
    a bias generator, responsive to the current signal, that generates a bias voltage; and
    a voltage controlled oscillator, responsive to the bias voltage, that generates an output clock signal.

14. The phase locked loop of claim 13, wherein the feedback clock signal is based on the output clock signal.

15. A method for post-silicon adjustment of a phase locked loop, comprising:

comparing an input clock signal and a feedback clock signal;

generating a current signal using a charge pump responsive to the comparing;

selectively adjusting the current signal using an adjustment signal generated independent of the feedback clock signal by an adjustment circuit operatively connected to the charge pump, wherein selectively adjusting the current signal comprises:

controlling a first current flow between a power supply and the adjustment signal; and controlling a second current flow between the adjustment signal and ground; and generating a bias voltage to a voltage controlled oscillator dependent on the selectively adjusting, wherein the voltage controlled oscillator generates an output clock signal.

16. The method of claim 15, wherein the feedback clock signal is based on the output clock signal.

* * * * *